(12) United States Patent
Nam et al.

(10) Patent No.: US 11,959,965 B2
(45) Date of Patent: Apr. 16, 2024

(54) TEST CIRCUIT USING CLOCK GATING SCHEME TO HOLD CAPTURE PROCEDURE AND BYPASS MODE, AND INTEGRATED CIRCUIT INCLUDING THE SAME

(71) Applicant: Samsung Electronics Co., Ltd., Suwon-si (KR)

(72) Inventors: Giha Nam, Hwaseong-si (KR); Sangsoon Im, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/851,860

(22) Filed: Jun. 28, 2022

(65) Prior Publication Data

US 2023/0152372 A1 May 18, 2023

(30) Foreign Application Priority Data

Nov. 12, 2021 (KR) .................. 10-2021-0156014
Jan. 13, 2022 (KR) .................. 10-2022-0005563

(51) Int. Cl.
*G01R 31/3177* (2006.01)
*G01R 31/317* (2006.01)

(52) U.S. Cl.
CPC ... *G01R 31/3177* (2013.01); *G01R 31/31701* (2013.01); *G01R 31/31712* (2013.01); *G01R 31/31723* (2013.01); *G01R 31/31727* (2013.01)

(58) Field of Classification Search
None
See application file for complete search history.

(56) References Cited

U.S. PATENT DOCUMENTS

| | | |
|---|---|---|
| 5,257,267 A | 10/1993 | Ishizaka |
| 5,710,779 A | 1/1998 | Whetsel |
| 6,499,124 B1 | 12/2002 | Jacobson |
| 6,587,981 B1 | 7/2003 | Muradali et al. |
| 7,308,631 B2 | 12/2007 | McLaurin |
| 7,823,034 B2 | 10/2010 | Wohl et al. |
| 7,941,717 B2 | 5/2011 | Waayers |
| 8,533,548 B2 | 9/2013 | Kim et al. |
| 8,732,632 B1 | 5/2014 | Keller et al. |
| 8,832,608 B1 | 9/2014 | Chakrabarty et al. |
| 10,289,577 B2 | 5/2019 | Karri et al. |
| 10,310,013 B2 | 6/2019 | Ge et al. |
| 2011/0133806 A1 | 6/2011 | Subramani et al. |
| 2017/0329728 A1* | 11/2017 | Karri ...................... G06F 21/79 |

FOREIGN PATENT DOCUMENTS

| | | | |
|---|---|---|---|
| EP | 0358376 A2 | 3/1990 | |
| KR | 1020110136531 A | 12/2011 | |
| WO | WO-2007049172 A1 * | 5/2007 | ..... G01R 31/318541 |
| WO | WO-2008026177 A1 * | 3/2008 | ....... G01R 31/31726 |

* cited by examiner

*Primary Examiner* — Guerrier Merant
(74) *Attorney, Agent, or Firm* — Muir Patent Law, PLLC

(57) ABSTRACT

Disclosed is a test circuit for testing an integrated circuit core or an external circuit of the integrated circuit core. The test circuit may not only transmit a cell function input to a cell function output using only one multiplexer in a bypass mode, may but also use a clock gating scheme capable of blocking a clock signal from transmitting to a scan flip-flop to hold a capture procedure.

19 Claims, 7 Drawing Sheets

| MODE | EXTEST | INTEST | OUTPUT1 | OUTPUT2 |
|---|---|---|---|---|
| INTEST MODE | L | H | L | CLK |
| EXTEST MODE | H | L | CLK | L |

TEST CIRCUIT USING CLOCK GATING SCHEME TO HOLD CAPTURE PROCEDURE AND BYPASS MODE, AND INTEGRATED CIRCUIT INCLUDING THE SAME

CROSS-REFERENCE TO RELATED APPLICATIONS

This application claims priority under 35 U.S.C. § 119 to Korean Patent Application Nos. 10-2021-0156014, filed on Nov. 12, 2021, and 10-2022-0005563, filed on Jan. 13, 2022, in the Korean Intellectual Property Office, the disclosures of which are incorporated by reference herein in their entireties.

BACKGROUND

Embodiments of the present disclosure relate to a test circuit capable of testing a test object, and more particularly, relate to a test circuit that may not only transmit a cell function input to a cell function output using only one multiplexer in a bypass mode but also uses a clock gating scheme to hold a capture procedure, and an integrated circuit including the same.

When a specific circuit or a specific core included in an integrated circuit is tested, the specific circuit or the specific core to be tested is needed to be electrically isolated from peripheral circuits.

During testing of a specific core included in a system, the specific core outputs a preset value such that output values of the specific core do not affect the system.

SUMMARY

Embodiments of the present disclosure provide a test circuit that may not only transmits a cell function input to a cell function output using only one multiplexer in a bypass mode but also uses a clock gating scheme to hold a capture procedure, and an integrated circuit including the same.

According to an embodiment of the present disclosure, a test circuit for testing an integrated circuit core or an external circuit of the integrated circuit core includes a bypass terminal configured to receive a bypass signal, a cell function input (CFI) terminal configured to receive a CFI signal from the integrated circuit core or the external circuit, a cell function output (CFO) terminal configured to transmit a CFO signal to the integrated circuit core or the external circuit, and a first multiplexer including a first select terminal connected to the bypass terminal, a first input terminal connected to the CFI terminal, a second input terminal, and a first output terminal connected to the CFO terminal. The first multiplexer transmits the CFI signal to the integrated circuit core or the external circuit through the first output terminal as the CFO signal in response to the bypass signal.

According to an embodiment of the present disclosure, a test circuit for testing an integrated circuit core or an external circuit of the integrated circuit core includes a clock gating circuit that receives a scan enable signal through a scan enable terminal, a clock signal through a clock signal terminal and a test signal, and that outputs a first output signal to control whether the clock signal is gated in response to a combination of the scan enable signal and the test signal, a cell function input (CFI) terminal configured to receive a CFI signal, a cell test input (CTI) terminal configured to receive a CTI signal, and a scan flip-flop that either holds or outputs data of captured one of the CFI signal input through the CFI terminal and the CTI signal input through the CTI terminal in response to the first output signal of the clock gating circuit.

According to an embodiment of the present disclosure, an integrated circuit includes an integrated circuit core, and a test circuit configured to test the integrated circuit core or an external circuit of the integrated circuit core, the test circuit includes an input cell that transmits a first signal to the integrated circuit core, and the input cell includes a first scan flip-flop, a first bypass terminal configured to receive a bypass signal, a first cell function input (CFI) terminal configured to receive a CFI signal from the external circuit, a first cell function output (CFO) terminal configured to transmit the first signal to the integrated circuit core, and a first multiplexer including a first select terminal connected to the first bypass terminal, a first input terminal connected to the first CFI terminal, a second input terminal, and a first output terminal connected to the first CFO terminal. The first multiplexer transmits the CFI signal to the integrated circuit core through the first output terminal as the first signal in response to the bypass signal.

According to an embodiment, the test circuit may further include a clock gating circuit that blocks a clock signal from transmitting to a clock terminal of the first scan flip-flop to hold an output signal of the first scan flip-flop in a capture mode.

BRIEF DESCRIPTION OF THE FIGURES

The above and other objects and features of the present disclosure will become apparent by describing in detail embodiments thereof with reference to the accompanying drawings.

FIG. 4 is a table illustrating signals related to an intest mode and an extest mode performed in a test circuit of FIG. 1 according to example embodiments.

DETAILED DESCRIPTION

Figure 1:
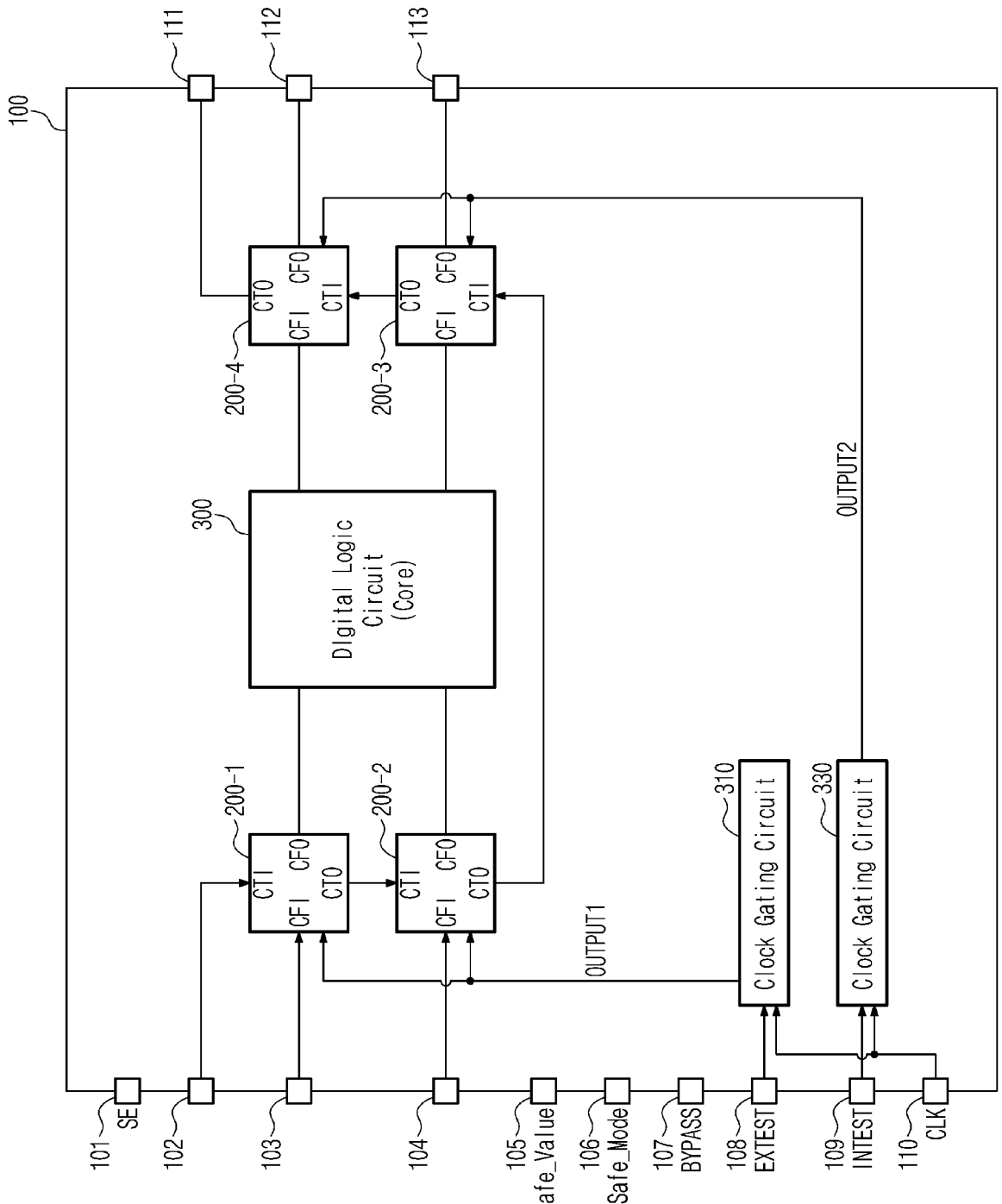
FIG. 1 is a block diagram illustrating an integrated circuit including a test circuit, according to an embodiment of the present disclosure.

FIG. 1 is a block diagram illustrating an integrated circuit including a test circuit, according to an embodiment of the present disclosure. Referring to FIG. 1, an integrated circuit (or an integrated circuit chip) 100 includes a plurality of terminals 101 to 113, a test circuit, and a digital logic circuit 300.

The test circuit includes a plurality of cells 200-1 to 200-4 forming a scan chain, a first clock gating circuit 310, and a second clock gating circuit 330.

The test circuit according to the present disclosure is used for testing a test object (e.g., an integrated circuit core or an external circuit of the integrated circuit core). According to embodiments, the external circuit may be connected to at least one terminal among the terminals 102, 103, and 104, or may be connected to at least one terminal among the terminals 111, 112, and 113. The external circuit may form a hierarchical structure with the integrated circuit core.

For example, the test circuit according to the present disclosure may be used for testing each of hierarchical cores in an integrated circuit having the hierarchical cores (e.g., a System on Chip (SoC) or a multicore processor, etc.) or may be used to electrically isolate the corresponding core under test from peripheral circuits or glue logic. In a normal mode or a function mode, the peripheral circuits or glue logic in the integrated circuit 100 may communicate with the digital logic circuit 300. For example, the peripheral circuits or glue logic may transmit and receive a plurality of signals to and from the digital logic circuit 300 in a normal operation of the integrated circuit 100. For example, programmable logic devices (PLDs) can play the role of the glue logic.

Each of the plurality of cells 200-1 to 200-4 has the same structure. First group cells 200-1 and 200-2 among the plurality of cells 200-1 to 200-4 performs a function as input cells (or input wrapper cells), and second group cells 200-3 and 200-4 among the plurality of cells 200-1 to 200-4 performs a function as output cells (or output wrapper cells).

In FIGS. 1 to 6, two input cells 200-1 and 200-2 and two output cells 200-3 and 200-4 are illustrated and described for convenience of description, but the number of input cells and the number of output cells included in the test circuit are not limited thereto. For example, at least one input cell having the same structure as that of the input cell 200-1 or 200-2 may be disposed between the input cells 200-1 and 200-2, and at least one output cell having the same structure as that of the output cell 200-3 or 200-3 may be disposed between the output cells 200-3 and 200-4.

Each of the input cells 200-1 and 200-2 transmits a corresponding CFO to the digital logic circuit 300, and each of the output cells 200-3 and 200-4 receive a corresponding CFI output from the digital logic circuit 300.

The CFI is also called a cell function input (or a cell function input signal) or a core function input (or a core function input signal), the CFO is also called a cell function output (or a cell function output signal) or a core function output (or a core function output signal), and the CTI is called a cell test input (or a cell test input signal) or a core test input (or a core test input signal), and the CTO is also called a cell test output (or a cell test output signal) or a core test output (or a core test output signal). For example, each of the CFI and the CTI may be a serial input signal.

IEEE STD 1500 is a standard for embedded core test and also is a scalable standard architecture that enables test reuse and integration for an embedded core and associated circuitry. The present disclosure refers to the IEEE STD 1500 wrapper by reference.

The digital logic circuit 300 is also called a core (or processing unit), a core logic circuit, or an integrated circuit core. The integrated circuit 100 may be used in an automobile or a high performance computing (HPC) device.

The first clock gating circuit 310 controls gating of a clock signal CLK received from a clock signal terminal 110 of the integrated circuit 100 to the input cells 200-1 and 200-2, and the second clock gating circuit 330 controls gating of the clock signal CLK to the output cells 200-3 and 200-4.

In an intest (or a first test) mode, the first clock gating circuit 310 outputs a non-toggling clock signal, that is, a first output signal OUTPUT1 having a low level to hold a capture procedure performed on the input cells 200-1 and 200-2. In an extest (or a second test) mode, the second clock gating circuit 330 outputs the non-toggling clock signal, that is, a second output signal OUTPUT2 having the low level to hold a capture procedure performed on the output cells 200-3 and 200-4.

In the intest mode, the first clock gating circuit 310 blocks the clock signal CLK from transmitting to the input cells 200-1 and 200-2, and the second clock gating circuit 330 transmits the clock signal CLK to the output cells 200-3 and 200-4. The intest mode refers to an operation mode in which a test object (e.g., the digital logic circuit 300) existing inside the integrated circuit 100 is tested.

In the extest mode, the first clock gating circuit 310 transmits the clock signal CLK to the input cells 200-1 and 200-2, and the second clock gating circuit 330 blocks the clock signal CLK from transmitting to the output cells 200-3 and 200-4. The extest mode refers to an operation mode in which a test object (e.g., the external circuit) existing outside the integrated circuit 100 is tested.

Figure 2:
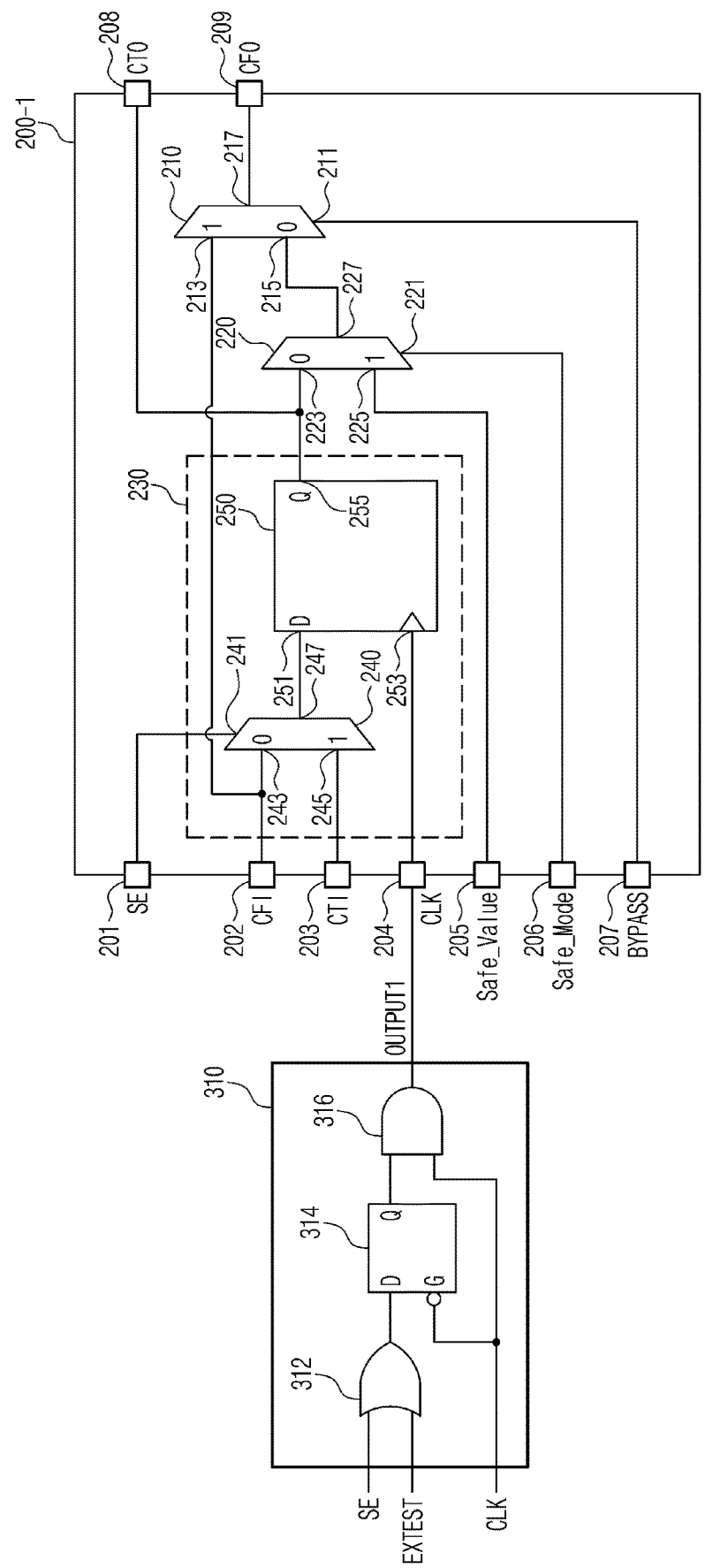
FIG. 2 is a circuit diagram illustrating a test circuit including a first clock gating circuit and an input wrapper cell illustrated in FIG. 1 according to example embodiments.
Figure 3:
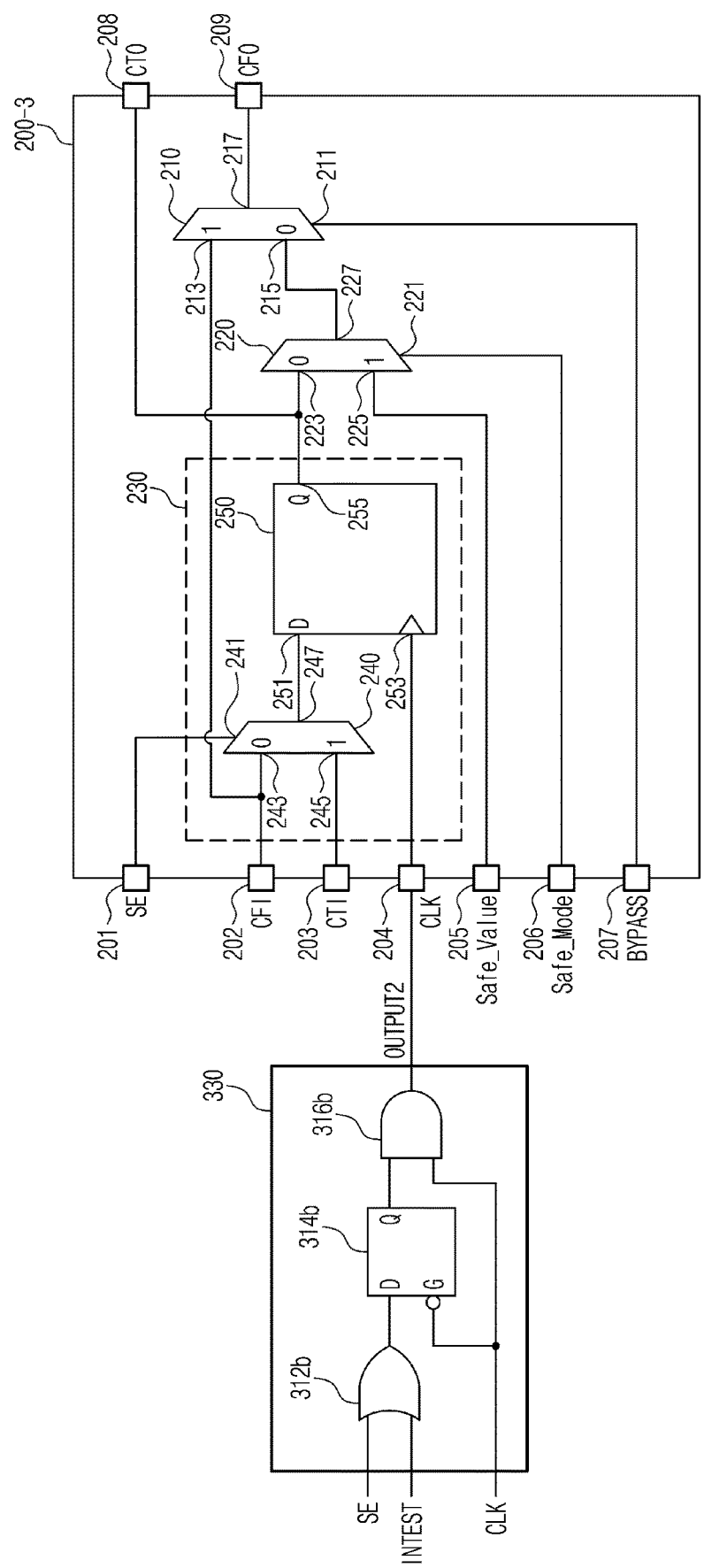
FIG. 3 is a circuit diagram illustrating a test circuit including a second clock gating circuit and an output wrapper cell illustrated in FIG. 1 according to example embodiments.

FIG. 2 is a circuit diagram illustrating a test circuit including a first clock gating circuit and an input wrapper cell illustrated in FIG. 1 according to example embodiments, and FIG. 3 is a circuit diagram illustrating a test circuit including a second clock gating circuit and an output wrapper cell illustrated in FIG. 1 according to example embodiments.

The structure of the first clock gating circuit 310 illustrated in FIG. 2 is the same as the structure of the second clock gating circuit 330 illustrated in FIG. 3. As shown in FIG. 2, an OR gate 312 of FIG. 2 receives a scan enable signal SE from a scan signal terminal 101 and an extest signal (or a second test signal EXTEST) from the extest signal terminal 108 in the integrated circuit 100. As shown in FIG. 3, an OR gate 312b of FIG. 3 receives the scan enable signal SE from the scan signal terminal 101 and an intest signal (or a first test signal INTEST) from the intest signal terminal 109 in the integrated circuit 100.

Referring to FIG. 2, the input cell 200-1 includes a plurality of terminals 201 to 209, a first multiplexer 210, a second multiplexer 220, and a scan flip-flop 230. In this case, a terminal is collectively referred to as a pin, a pad, or a port.

Referring to FIGS. 1 and 2, the terminals 101 and 201 related to the scan enable signal SE are connected to each other, the terminals 102 and 203 related to the CTI are connected to each other, and the terminals 103 and 202 related to the CFI are connected to each other, the terminals 105 and 205 related to a safe value Safe_Value are connected to each other, the terminals 106 and 206 related to a safe mode signal Safe_Mode are connected to each other, and the terminals 107 and 207 related to a bypass signal BYPASS are connected to each other.

The first multiplexer 210 includes a first selection terminal 211 connected to the bypass terminal 207, a first input terminal 213 connected to the CFI terminal 202, a second input terminal 215, and a first output terminal 217 connected to the CFO terminal 209.

When the bypass signal BYPASS having a high level (or logic 1) is input to the first selection terminal 211 through the bypass terminal 207, the first multiplexer 210 outputs the CFI input through the CFI terminal 202 to the CFO terminal 209. When the bypass signal BYPASS having the low level (or logic 0) is input to the first selection terminal 211 through the bypass terminal 207, the first multiplexer 210 outputs an input signal of the second input terminal 215 to the CFO terminal 209.

Since the CFI bypasses the scan flip-flop 230 and is output to the CFO through only the first multiplexer 210, compared to the conventional wrapper cell in which the CFI is output to the CFO sequentially through two multiplexers, the input cell 200-1 according to the present disclosure reduces the time for which the CFI is transmitted.

When the input cell 200-1 according to the present disclosure is located on a critical path, there is an effect that a timing risk due to the input cell 200-1 may be reduced.

When a CPU includes the input cells 200-1 and 200-2, the timing margin of the CPU may be improved, and a transition fault coverage between an internal digital logic circuit of the CPU and an external digital logic circuit of the CPU may have an effect of increasing.

The transition fault means that a fault occurs when a signal transitions from a logic '0' to a logic '1' or from the logic '1' to the logic '0', and the transition fault coverage means that how many defects may be detected by the test with respect to testable faults. The transition fault is also called a transition delay fault.

In a bypass mode (i.e., an operation mode when the bypass signal BYPASS is at a high level), a Transition Automatic Test Pattern Generator (ATPG) capable of detecting a transition fault may detect the transition fault on a function path existing between an internal digital logic circuit of the device (e.g., the CPU) under test and a boundary digital logic circuit for the device under test. The function path may mean a path through which the CFI is transmitted.

The second multiplexer 220 includes a second selection terminal 221 connected to the safe mode terminal 206, a third input terminal 223 connected to an output terminal 255 (or Q) of the scan flip-flop 230, a fourth input terminal 225 connected to a safe value terminal 205, and a second output terminal 227 connected to the second input terminal 215 of the first multiplexer 210.

In the safe mode, when the safe mode signal Safe_Mode having a high level is input to the second selection terminal 221 through the safe mode terminal 206, the second multiplexer 220 outputs a safe value Safe_Value (or safe data) input to the fourth input terminal 225 to the second input terminal 215 of the first multiplexer 210 through the second output terminal 227. In the safe mode, the first multiplexer 210 outputs the safe value Safe_Value to the CFO terminal 209 in response to the bypass signal BYPASS having a low level.

In the safe mode, the safe value (Safe_Value) is output as the CFO through the two multiplexers 210 and 220.

The output terminal 255 of the scan flip-flop 230 is connected to the CTO terminal 208. The scan flip-flop 230 includes a third multiplexer 240 and a D-flip-flop 250.

The third multiplexer 240 includes a third selection terminal 241 connected to the scan enable terminal 201 for receiving the scan enable signal SE, a fifth input terminal 243 connected to the CFI terminal 202, a sixth input terminal 245 connected to the CTI terminal 203, and a third output terminal 247.

When the scan enable signal SE is at a low level (i.e., in a capture mode or in a capture procedure), the third multiplexer 240 outputs the CFI input to the fifth input terminal 243 to an input terminal 251 (or D) of the D-flip-flop 250 through the third output terminal 247.

When the scan enable signal SE is at a high level (i.e., in a shift mode or in a shift procedure), the third multiplexer 240 outputs the CTI input to the sixth input terminal 245 to the input terminal 251 of the D-flip-flop 250 through the third output terminal 247.

The D-flip-flop 250 includes the input terminal 251 connected to the third output terminal 247 of the third multiplexer 240, a clock terminal 253 connected to a clock signal terminal 204, and the output terminal 255 connected to the third input terminal 223 of the second multiplexer 220.

The D-flip-flop 250 captures an output signal (the CFI or the CTI) output from the third output terminal 247 of the third multiplexer 240 in response to a first edge (e.g., a rising edge) of a clock signal CLK (OUTPUT1) received through the clock signal terminal 204.

The D-flip-flop 250 may perform a holding operation or a shift operation depending on whether the clock signal CLK as the first output signal OUTPUT1 is toggled.

The first or second clock gating circuit 310 or 330 controls whether the clock signal CLK of the clock signal terminal 110 is gated in response to a combination of the scan enable signal SE and the test signal (the EXTEST or the INTEST).

The first clock gating circuit 310 illustrated in FIG. 2 controls whether the clock signal CLK of the clock signal terminal 110 is gated in response to the combination of the scan enable signal SE and the extest signal EXTEST.

The first clock gating circuit 310 includes the OR gate 312, a gated D-latch 314, and an AND gate 316.

The OR gate 312 performs an OR operation between the scan enable signal SE and the extest signal EXTEST, and the gated D-latch 314 latches the output signal of the OR gate 312 input to an input terminal D of the gated D-latch 314 in response to a second edge (e.g., a falling edge) of the clock signal CLK of the clock signal terminal 110 input to a terminal G of the gated D-latch 314.

The AND gate 316 performs an AND operation between the clock signal CLK of the clock signal terminal 110 and the output signal output through the output terminal Q of the gated D-latch 314 and transmits the first output signal OUTPUT1 to the clock signal terminal 204 of the input cell 200-1.

The second clock gating circuit 330 illustrated in FIG. 3 controls whether the clock signal CLK of the clock signal terminal 110 is gated in response to the combination of the scan enable signal SE and the intest signal INTEST.

The second clock gating circuit 330 includes the OR gate 312b, a gated D-latch 314b, and an AND gate 316b.

The OR gate 312b performs an OR operation between the scan enable signal SE and the intest signal INTEST, and the gated D-latch 314b latches the output signal of the OR gate 312b input to the input terminal D of the gated D-latch 314b in response to the second edge (e.g., a falling edge) of the clock signal CLK of the clock signal terminal 110 input to the terminal G of the gated D-latch 314b.

The AND gate 316b performs an AND operation between the clock signal CLK of the clock signal terminal 110 and the output signal output through the output terminal Q of the gated D-latch 314b and transmits the second output signal OUTPUT2 to the clock signal terminal 204 of the output cell 200-3.

Since the structure of the input cell 200-1 illustrated in FIG. 2 is the same as the structure of the output cell 200-3 illustrated in FIG. 3, the same reference numbers as those of the input cell 200-1 are used for the output cell 200-3, and additional descriptions of components included in the output cell 200-3 are omitted to avoid redundancy.

FIG. 4 is a table illustrating signals related to an intest mode and an extest mode performed in a test circuit of FIG. 1 according to example embodiments.

Referring to FIGS. 1 to 4, in the capture procedure of the INTEST MODE, it is assumed that the scan enable signal SE is at a low level 'L', the extest signal EXTEST is at the low level 'L', the intest signal INTEST is at a high level 'H', the safe mode signal Safe_Mode is at the low level and the bypass signal BYPASS is at the low level 'L'.

In the INTEST MODE, since the OR gate 312 of FIG. 2 outputs an output signal having a low level and the gated D-latch 314 latches an output signal of the OR gate 312 having a low level in response to the second edge of the clock signal CLK of the clock signal terminal 110, the AND gate 316 outputs the first output signal OUTPUT1 having the low level 'L' to the clock signal terminal 204 of each of the input cells 200-1 and 200-2.

Accordingly, the D-flip-flop 250 of each of the input cells 200-1 and 200-2 holds the data captured immediately before in response to the first output signal OUTPUT1 having the low level 'L', that is, a non-toggling clock signal. For example, the D-flip-flop 250 of each of the input cells 200-1 and 200-2 holds captured data of the CFI or CTI signal.

In the INTEST MODE, since the OR gate 312b of FIG. 3 outputs an output signal having a high level, and the gated D-latch 314b latches an output signal of the OR gate 312b having a high level in response to the second edge of the clock signal CLK of the clock signal terminal 110, the AND gate 316b outputs a clock signal CLK as the second output signal OUTPUT2 to the clock signal terminal 204 of each of the output cells 200-3 and 200-4.

Accordingly, the D-flip-flop 250 of each of the output cells 200-3 and 200-4 outputs the corresponding CFI to the terminals 208 and 209 in response to the first edge of the clock signal CLK as the second output signal OUTPUT2.

In the capture procedure of the EXTEST MODE, it is assumed that the scan enable signal SE is at the low level 'L', the extest signal EXTEST is at the high level 'H', the intest signal INTEST is at the low level 'L', the safe mode signal Safe_Mode is at the low level and the bypass signal BYPASS is at the low level 'L'.

In the EXTEST MODE, since the OR gate 312 of FIG. 2 outputs an output signal having a high level, and the gated D-latch 314 latches an output signal of the OR gate 312 having a high level in response to the second edge of the clock signal CLK of the clock signal terminal 110, the AND gate 316 outputs the clock signal CLK as the first output signal OUTPUT1 to the clock signal terminal 204 of each of the input cells 200-1 and 200-2.

Accordingly, the D-flip-flop 250 of each of the input cells 200-1 and 200-2 outputs the corresponding CFI to the terminals 208 and 209 in response to the first edge of the clock signal CLK as the first output signal OUTPUT1.

In the EXTEST MODE, since the OR gate 312b of FIG. 3 outputs an output signal having a low level and the gated D-latch 314b latches an output signal of the OR gate 312 having a low level in response to the second edge of the clock signal CLK of the clock signal terminal 110, the AND gate 316b outputs the second output signal OUTPUT2 having the low level 'L' to the clock signal terminal 204 of each of the output cells 200-3 and 200-4.

Accordingly, the D-flip-flop 250 of each of the output cells 200-3 and 200-4 holds the data captured immediately before in response to the second output signal OUTPUT2 having the low level 'L', that is, a non-toggling clock signal.

Figure 5:
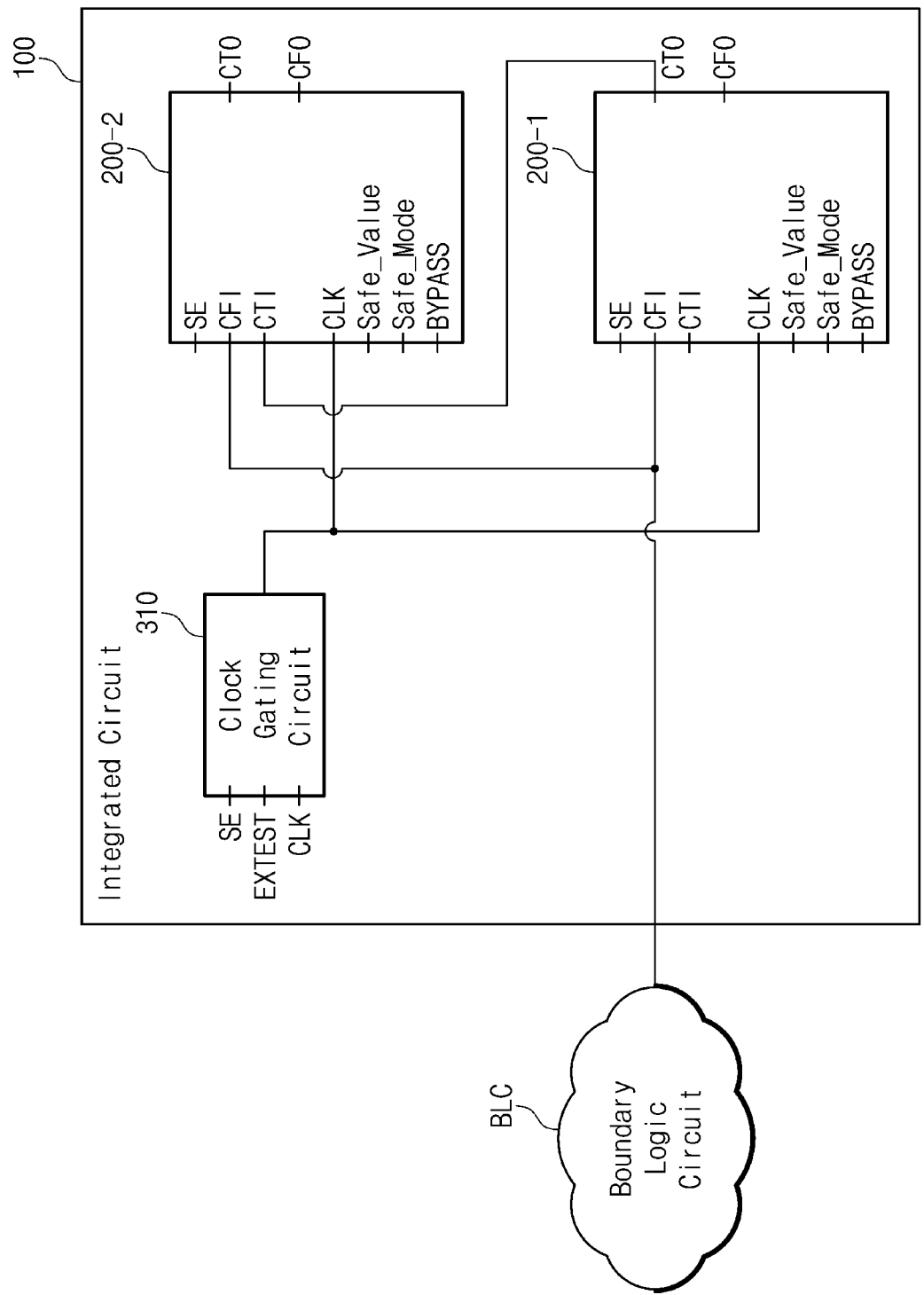
FIG. 5 illustrates a connection relationship between an integrated circuit and a boundary logic circuit of FIG. 1 according to example embodiments.

FIG. 5 illustrates a connection relationship between an integrated circuit and a boundary logic circuit of FIG. 1 according to example embodiments. Referring to FIGS. 1 to 5, the CFI output from a boundary logic circuit BLC is transmitted to the first input cell 200-1 through the terminal 103 and is transmitted to the second input cell 200-2 through the terminal 104. The CTO of the first input cell 200-1 is transmitted to the CTI of the second input cell 200-2.

Figure 6:
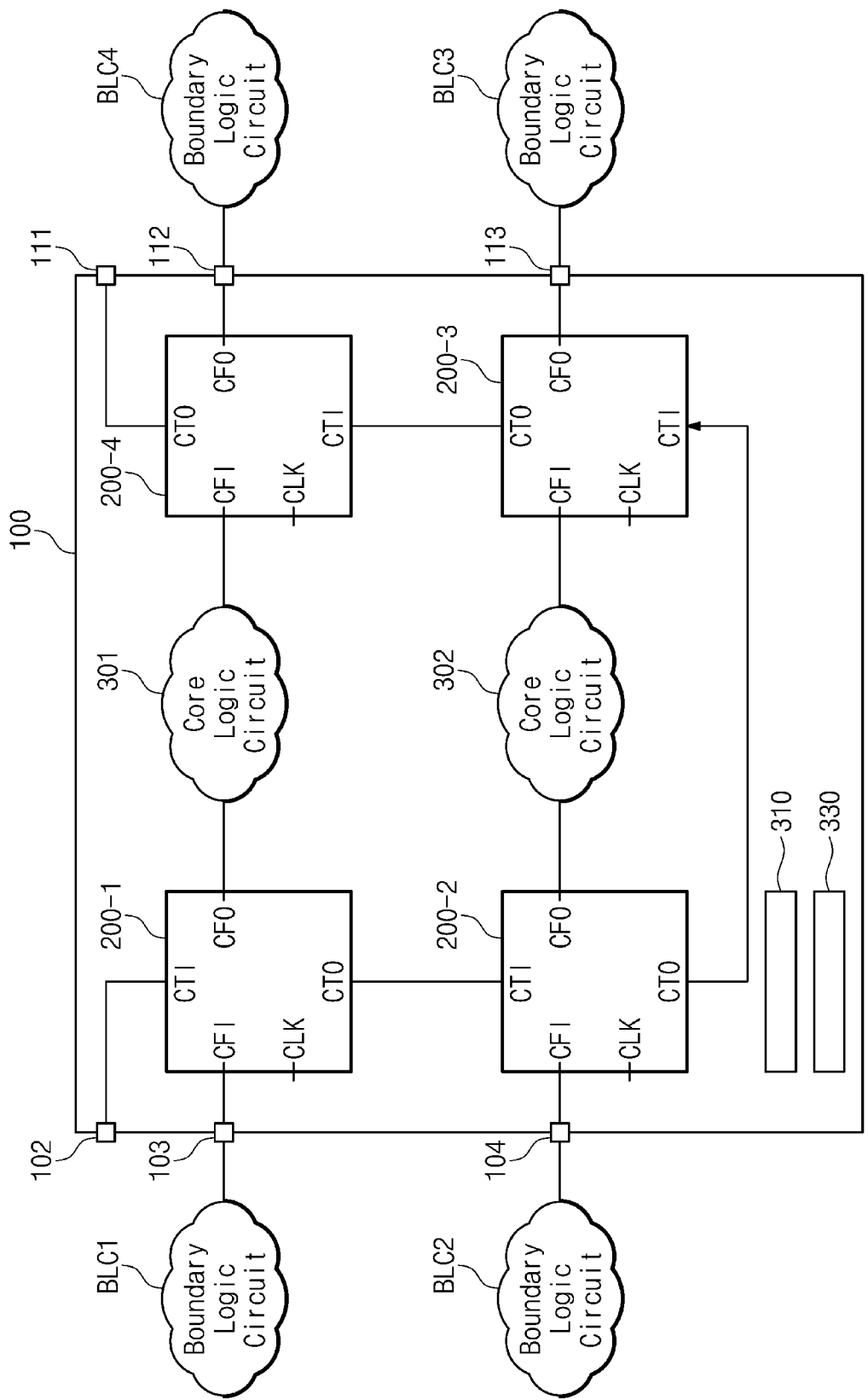
FIG. 6 is a diagram describing how a core logic circuit and a boundary logic circuit are tested using a test circuit according to example embodiments.

FIG. 6 is a diagram describing how a core logic circuit and a boundary logic circuit are tested using a test circuit according to example embodiments.

Referring to FIGS. 1 to 4 and 6, a signal output from a first boundary logic circuit BLC1 may be transmitted as the CFI to the input cell 200-1 through the terminal 103, the CFO output from the input cell 200-1 may be transmitted to a first core logic circuit 301, a signal output from the first core logic circuit 301 may be transmitted as the CFI to the output cell 200-4, and an output signal of the second output cell 200-4 may be transmitted as the CFO to a fourth boundary logic circuit BLC4 through the terminal 112.

A signal output from a second boundary logic circuit BLC2 may be transmitted as the CFI to the input cell 200-2 through the terminal 104, the CFO output from the input cell 200-2 may be transmitted to a second core logic circuit 302, a signal output from the second core logic circuit 302 may be transmitted as the CFI to the output cell 200-3, and an output signal of the first output cell 200-3 may be transmitted as the CFO to a third boundary logic circuit BLC3 through the terminal 113. Each of the boundary logic circuits BLC1 to BLC4 may be an external circuit of the first or second core logic circuit 301 or 302. In example embodiments, an external circuit of the first or second core logic circuit 301 or 302 may include the boundary logic circuits BLC1 to BLC4.

Figure 7:
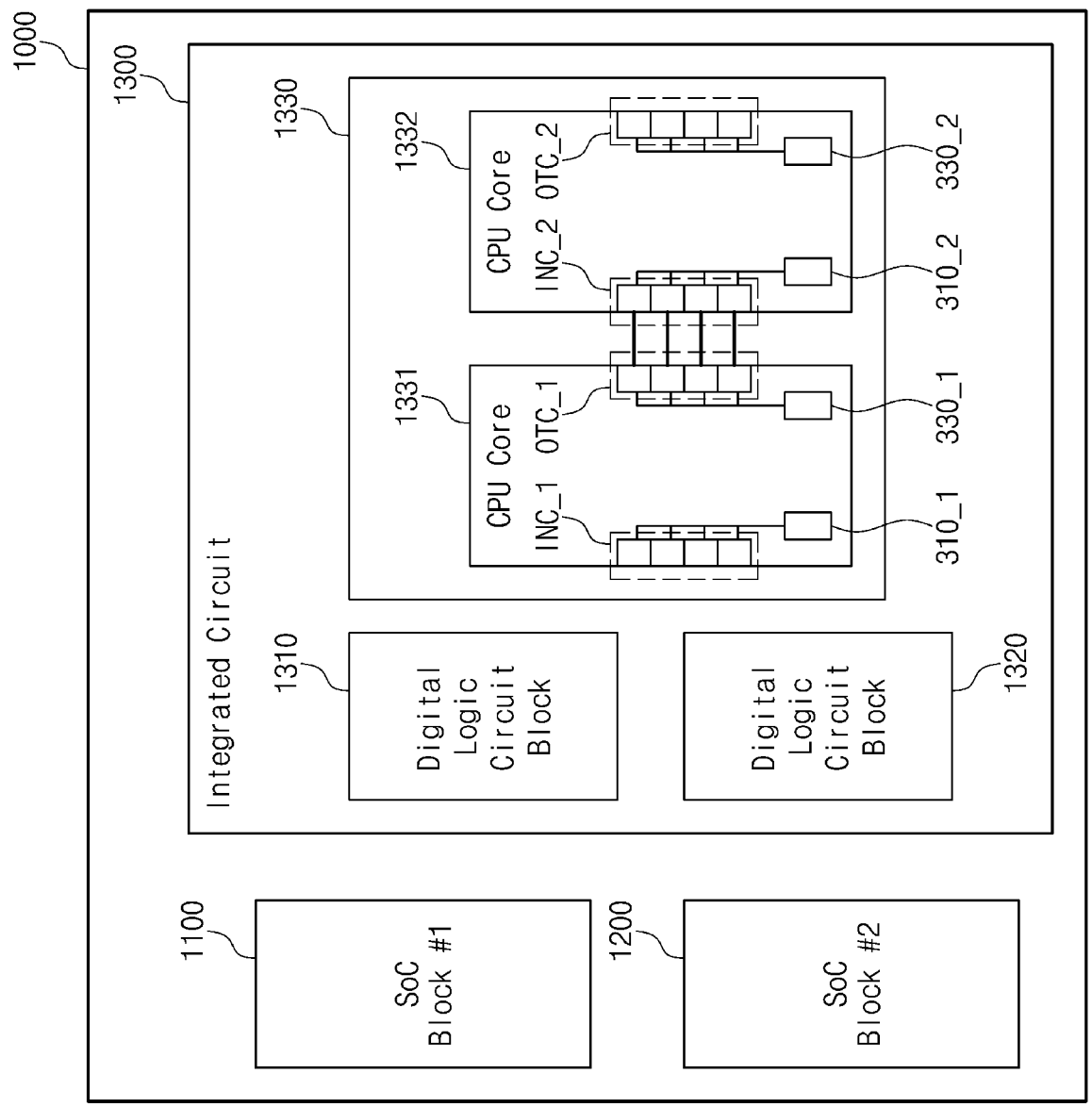
FIG. 7 is a diagram illustrating an electronic system including hierarchical cores including an integrated circuit including a test circuit illustrated in FIG. 1, according to example embodiments.

FIG. 7 is a diagram illustrating an electronic system including hierarchical cores including an integrated circuit including a test circuit illustrated in FIG. 1, according to example embodiments.

An electronic system 1000 may be a digital logic circuit system or a printed circuit board (PCB), but is not limited thereto.

The electronic system 1000 includes a plurality of system on chip (SoC) blocks 1100 and 1200, and an integrated circuit 1300. For example, the integrated circuit 1300 may be a DynamIQ shared unit (DSU).

Each of the SoC blocks 1100 and 1200 may include at least one SoC.

The integrated circuit 1300 may include a plurality of digital logic circuit blocks 1310 and 1320, and a CPU core cluster 1330. The CPU core cluster 1330 includes a plurality of CPU cores 1331 and 1332.

In some examples, the integrated circuit 1300 may correspond to the integrated circuit 100, the CPU core cluster 1330 may correspond to the test circuit of FIG. 1, and the plurality of digital logic circuit blocks 1310 and 1320 may correspond to the digital logic circuit 300. In some examples, each of the plurality of SoC blocks 1100 and 1200 may be an external circuit of the integrated circuit 1300.

For example, when the components 1100, 1200, 1300, 1310, 1320, 1330, 1331, and 1332 included in the electronic system 1000 form a hierarchical structure, each of the components 1100, 1200, and 1300 may have a first hierarchical level, each of the components 1310, 1320, and 1330 may have a second hierarchical level lower than the first hierarchical level, and each of the components 1331 and 1332 may have a third hierarchical level lower than the second hierarchical level.

For example, the CPU core cluster 1330 may be a parent CPU core, and each of the CPU cores 1331 and 1332 may be a child CPU core.

According to example embodiments, the first CPU core 1331 may be a high-performance core with relatively high power consumption, and the second CPU core 1332 may be a low-performance core with relatively low power consumption, and vice versa.

The first CPU core 1331 includes a first input cell chain INC_1 including a first group of cells, a first clock gating circuit 310_1 capable of gating a clock signal transmitted to each of the first group of cells, a first output cell chain OTC_1 including a second group of cells, and a second clock gating circuit 330_1 capable of gating a clock signal transmitted to each of the second group of cells.

The structure and operation of each of the first group of cells included in the first input cell chain INC_1 are the same as those of the input cell 200-1 described with reference to FIGS. 1 and 2, and the structure and operation of the first clock gating circuit 310_1 are the same as those of the first clock gating circuit 310 described with reference to FIGS. 1 and 2.

The structure and operation of each of the second group of cells included in the first output cell chain OTC_1 are the same as those of the output cell 200-3 described with reference to FIGS. 1 and 3, and the structure and operation of the second clock gating circuit 330_1 are the same as those of the second clock gating circuit 330 described with reference to FIGS. 1 and 3.

The second CPU core 1332 includes a second input cell chain INC_2 including a third group of cells, a first clock gating circuit 310_2 capable of gating a clock signal transmitted to each of the third group of cells, a second output cell chain OTC_2 including a fourth group of cells, and a second clock gating circuit 330_2 capable of gating a clock signal transmitted to each of the fourth group of cells.

The structure and operation of each of the third group of cells included in the second input cell chain INC_2 are the same as those of the input cell 200-1 described with reference to FIGS. 1 and 2, and the structure and operation of the first clock gating circuit 310_2 are the same as those of the first clock gating circuit 310 described with reference to FIGS. 1 and 2.

The structure and operation of each of the fourth group of cells included in the second output cell chain OTC_2 are the same as those of the output cell 200-3 described with reference to FIGS. 1 and 3, and the structure and operation of the second clock gating circuit 330_2 are the same as those of the second clock gating circuit 330 described with reference to FIGS. 1 and 3.

For example, each of the first group of cells included in the first input cell chain INC_1 may transmit or receive a signal to or from each of the output cells included in an output cell chain included in another digital logic circuit (e.g., a digital logic circuit or a CPU core of a higher layer than that of the first CPU core 1331), and each of the second group of cells included in the first output cell chain OTC_1 and each of the third group of cells included in the second input cell chain INC_2 may transmit or receive a signal to each other. In addition, each of the fourth group of cells included in the second output cell chain OTC_2 may transmit or receive a signal to or from each of the input cells included in an input cell chain included in another digital logic circuit (e.g., a digital logic circuit or a CPU core of a lower layer than that of the second CPU core 1332).

According to example embodiments of the present disclosure, a test circuit and an integrated circuit including the same may transmit a cell function input to a cell function output using only one multiplexer in a bypass mode, thereby reducing the transmission delay, and also may use a clock gating scheme instead of a feedback loop scheme to hold a capture procedure, thereby enhancing the detection of transition delay faults.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A test circuit for testing an integrated circuit core or an external circuit of the integrated circuit core, the test circuit comprising:
 a bypass terminal configured to receive a bypass signal;
 a cell function input (CFI) terminal configured to receive a CFI signal from the integrated circuit core or the external circuit;
 a cell function output (CFO) terminal configured to transmit a CFO signal to the integrated circuit core or the external circuit;
 a first multiplexer including a first selection terminal connected to the bypass terminal, a first input terminal connected to the CFI terminal, a second input terminal, and a first output terminal connected to the CFO terminal, and the first multiplexer configured to transmit the CFI signal to the integrated circuit core or the external circuit through the first output terminal as the CFO signal in response to the bypass signal;
 a scan flip-flop;
 a second multiplexer including a second selection terminal connected to a safe mode terminal configured to receive a safe mode signal, a third input terminal connected to an output terminal of the scan flip-flop, a fourth input terminal connected to a safe value terminal configured to receive a safe value signal, and a second output terminal connected to the second input terminal of the first multiplexer, and
 a cell test output (CTO) terminal connected to the output terminal of the scan flip-flop.

2. The test circuit of claim 1, further comprising:
 a clock gating circuit configured to receive a scan enable signal through a scan enable terminal, a clock signal through a clock signal terminal and a test signal, and output a first output signal to control whether the clock signal is gated in response to a combination of the scan enable signal and the test signal,
 wherein the scan flip-flop includes:
 a third multiplexer including a third selection terminal connected to the scan enable terminal, a fifth input terminal connected to the CFI terminal, a sixth input terminal connected to a cell test input (CTI) terminal configured to receive a CTI signal, and a third output terminal; and
 a D-flip-flop configured to capture an output signal output from the third output terminal of the third multiplexer in response to the first output signal received through a clock terminal, and to transmit the captured output signal to the third input terminal of the second multiplexer.

3. The test circuit of claim 2, wherein the clock gating circuit includes:
 an OR gate configured to receive the scan enable signal and the test signal;
 a gated D-latch configured to latch an output signal of the OR gate in response to the clock signal; and an AND gate configured to perform an AND operation between the clock signal and an output signal from the gated D-latch to transmit the first output signal to the clock terminal.

4. The test circuit of claim 1, wherein:
the test circuit includes a wrapper cell configured to electrically isolate the integrated circuit core or the external circuit from a peripheral circuit, and
the wrapper cell includes the bypass terminal, the CFI terminal, the CFO terminal, and the first multiplexer.

5. The test circuit of claim 1, wherein the test circuit is configured to test each of hierarchical cores.

6. A test circuit for testing an integrated circuit core or an external circuit of the integrated circuit core, the test circuit comprising:
a clock gating circuit configured to:
receive a scan enable signal through a scan enable terminal, a clock signal through a clock signal terminal and a test signal, and
output a first output signal to control whether the clock signal is gated in response to a combination of the scan enable signal and the test signal;
a cell function input (CFI) terminal configured to receive a CFI signal;
a cell test input (CTI) terminal configured to receive a CTI signal; and
a scan flip-flop configured to:
receive the first output signal, the CFI signal, and the CTI signal, and
either hold or output data of captured one of the CFI signal input through the CFI terminal and the CTI signal input through the CTI terminal in response to the first output signal of the clock gating circuit.

7. The test circuit of claim 6, further comprising:
a bypass terminal configured to receive a bypass signal;
a CFO (cell function output) terminal configured to transmit a CFO signal to the integrated circuit core or the external circuit; and
a first multiplexer including a first selection terminal connected to the bypass terminal, a first input terminal connected to the CFI terminal, a second input terminal, and a first output terminal connected to the CFO terminal, and the first multiplexer configured to transmit the CFI signal to the integrated circuit core or the external circuit through the first output terminal as the CFO signal in response to the bypass signal.

8. The test circuit of claim 7, further comprising:
a second multiplexer including a second selection terminal connected to a safe mode terminal configured to receive a safe mode signal, a third input terminal connected to an output terminal of the scan flip-flop, a fourth input terminal connected to a safe value terminal configured to receive a safe value signal, and a second output terminal connected to the second input terminal of the first multiplexer; and
a cell test output (CTO) terminal connected to the output terminal of the scan flip-flop.

9. The test circuit of claim 6, wherein the clock gating circuit includes:
an OR gate configured to receive the scan enable signal and the test signal;
a gated D-latch configured to latch an output signal of the OR gate in response to the clock signal; and
an AND gate configured to perform an AND operation between the clock signal and an output signal from the gated D-latch to transmit the first output signal to a clock terminal of the scan flip-flop.

10. The test circuit of claim 6, wherein the clock gating circuit is configured to block the clock signal from transmitting to the scan flip-flop to hold data of captured CFI or CTI signal by the scan flip-flop in response to the scan enable signal having a low level and the test signal having the low level.

11. An integrated circuit comprising:
an integrated circuit core; and
a test circuit configured to test the integrated circuit core or an external circuit of the integrated circuit core, and the test circuit including:
an input cell configured to transmit a first signal to the integrated circuit core, and the input cell including:
a first scan flip-flop;
a first bypass terminal configured to receive a bypass signal;
a first cell function input (CFI) terminal configured to receive a CFI signal from the external circuit;
a first cell function output (CFO) terminal configured to transmit the first signal to the integrated circuit core; and
a first multiplexer including a first selection terminal connected to the first bypass terminal, a first input terminal connected to the first CFI terminal, a second input terminal, and a first output terminal connected to the first CFO terminal, and the first multiplexer configured to transmit the CFI signal to the integrated circuit core through the first output terminal as the first signal in response to the bypass signal;
a second multiplexer including a second selection terminal connected to a safe mode terminal configured to receive a safe mode terminal, a third input terminal connected to an output terminal of the first scan flip-flop, a fourth input terminal connected to a safe value terminal configured to receive a safe value signal, and a second output terminal connected to the second input terminal of the first multiplexer; and
a cell test output (CTO) terminal connected to the output terminal of the first scan flip-flop.

12. The integrated circuit of claim 11, wherein the test circuit further includes:
a clock gating circuit configured to block a clock signal from transmitting to a first clock terminal of the first scan flip-flop to hold an output signal of the first scan flip-flop in a capture mode of the integrated circuit.

13. The integrated circuit of claim 11, wherein the test circuit further includes:
an OR gate configured to receive a scan enable signal and an extest signal;
a gated D-latch configured to latch an output signal of the OR gate in response to a clock signal received from a clock signal terminal; and
an AND gate configured to perform an AND operation between the clock signal and an output signal of the gated D-latch to transmit a first output signal to a first clock terminal of the first scan flip-flop.

14. The integrated circuit of claim 11, wherein the test circuit further includes:
a first clock gating circuit configured to control gating of a clock signal received from a clock signal terminal and transmit a first output signal to a first clock terminal of the first scan flip-flop in response to a scan enable signal and an extest signal.

15. The integrated circuit of claim 14, wherein the test circuit further includes:

an output cell configured to receive a second signal from the integrated circuit core, and the output cell including:
a second scan flip-flop;
a second bypass terminal configured to receive a second bypass signal;
a second CFI terminal configured to receive the second signal from the integrated circuit core; and
a second CFO terminal configured to transmit a third signal to the external circuit.

16. The integrated circuit of claim 15, wherein the test circuit further includes:
a second clock gating circuit configured to block the clock signal from transmitting to a second clock terminal of the second scan flip-flop to hold an output signal of the second scan flip-flop in a capture mode of the integrated circuit.

17. The integrated circuit of claim 15, wherein the test circuit further includes:
a second clock gating circuit configured to control gating of the clock signal and transmit a second output signal to a second clock terminal of the second scan flip-flop in response to the scan enable signal and an intest signal.

18. The integrated circuit of claim 17, wherein, in an intest mode of the integrated circuit:
the first clock gating circuit is configured to block the clock signal from transmitting to the first clock terminal of the first scan flip-flop, and
the second clock gating circuit is configured to transmit the clock signal to the second clock terminal of the second scan flip-flop.

19. The integrated circuit of claim 17, wherein, in an extest mode of the integrated circuit:
the first clock gating circuit is configured to transmit the clock signal to the first clock terminal of the first scan flip-flop, and
the second clock gating circuit is configured to block the clock signal from transmitting to the second clock terminal of the second scan flip-flop.

* * * * *